(12) United States Patent
Mader

(10) Patent No.: US 6,169,428 B1
(45) Date of Patent: Jan. 2, 2001

(54) SINGLE SUPPLY VOLTAGE TO FREQUENCY CONVERTER OPTIMIZED FOR LOW VOLTAGE SENSING ABOVE AND BELOW GROUND

(75) Inventor: Urs H. Mader, Sunnyvale, CA (US)

(73) Assignee: Maxim Integrated Products, Inc., Sunnyvale, CA (US)

(*) Notice: Under 35 U.S.C. 154(b), the term of this patent shall be extended for 0 days.

(21) Appl. No.: 09/339,066

(22) Filed: Jun. 23, 1999

Related U.S. Application Data

(63) Continuation of application No. 08/950,698, filed on Oct. 15, 1997.

(51) Int. Cl.[7] .................................................. H03K 5/13
(52) U.S. Cl. ............................ 327/101; 327/74; 327/157
(58) Field of Search .................................... 327/100, 101, 327/74, 76, 148, 157

(56) References Cited

U.S. PATENT DOCUMENTS

| | | | |
|---|---|---|---|
| 3,842,371 | 10/1974 | Kelley | 331/143 |
| 3,989,961 | 11/1976 | Masreliez | 327/101 |
| 4,786,877 | 11/1988 | Leydier | 330/9 |
| 4,912,423 | 3/1990 | Milkovic et al. | 330/9 |
| 4,994,807 | 2/1991 | Hobbs | 341/157 |
| 5,486,788 | 1/1996 | Schlager et al. | 330/9 |
| 5,495,193 | 2/1996 | Nukui | 327/101 |
| 5,600,247 | 2/1997 | Matthews | 324/426 |

FOREIGN PATENT DOCUMENTS 2 296 399   6/1996   (GB).

*Primary Examiner*—Tuan T. Lam
(74) *Attorney, Agent, or Firm*—Blakely, Sokoloff, Taylor & Zafman LLP

(57) ABSTRACT

A voltage to frequency converter using a charge pump to restore the output voltage of the input integrator. The charge pump implementation allows the voltage to frequency converter's input to sense voltage above and below ground with a single supply using a charge pump, which can provide either a positive charge or a negative charge as the restoring force to the integrator. Inclusion of an interleaved charge pump provides advantages of implementation simplicity and of high performance. The voltage to frequency converter concentrates all offset and leakage errors at the input of the integrator amplifier, which in the preferred embodiment is a chopper stabilized amplifier providing very low offset. The voltage to frequency converter is intended for realization in integrated circuit form, providing very high performance in an integrated circuit having very low power requirements.

18 Claims, 8 Drawing Sheets

State Transitions are all positive edge-triggered

| A | B | Name | Description |
|---|---|------|-------------|
| 0 | 0 | DSG2 | Cp2 adds charge to integrator Cp1 = 0 |
| 0 | 1 | CHG2 | Cp2 subtracts charge from integrator Cp1 = Vref |
| 1 | 0 | CHG1 | Cp1 subtracts charge from integrator Cp2 = Vref |
| 1 | 1 | DSG1 | Cp1 adds charge to integrator Cp2 = 0 |

SINGLE SUPPLY VOLTAGE TO FREQUENCY CONVERTER OPTIMIZED FOR LOW VOLTAGE SENSING ABOVE AND BELOW GROUND

This United States (US) Patent Application filed by inventor Urs H. Mader is a continuation of U.S. patent application Ser. No. 08/950,698, filed by inventor Urs H. Mader on Oct. 15, 1997, Attorney Docket No. 055123. P088, entitled "SINGLE SUPPLY VOLTAGE TO FREQUENCY CONVERTER OPTIMIZED FOR LOW VOLTAGE SENSING ABOVE AND BELOW GROUND" and claims the benefit thereof.

BACKGROUND OF THE INVENTION

1. Field of the Invention

The present invention relates to the field of voltage to frequency converters.

2. Prior Art

Voltage to frequency converters of various kinds are known in the prior art. One type of such converter uses a current source or current sources triggered by one-shot devices to provide a charge equal to I * ΔT as a restoring force to an input integrator. The present invention provides an alternate design readily fabricated in integrated circuit form, operating on a single voltage supply, having high performance, and being capable of operating on input signals both above and below circuit ground.

BRIEF SUMMARY OF THE INVENTION

A voltage to frequency converter using a charge pump to restore the output voltage of the input integrator. The charge pump implementation allows the voltage to frequency converter's input to sense voltage above and below ground with a single supply using a charge pump, which can provide either a positive charge or a negative charge as the restoring force to the integrator. Inclusion of an interleaved charge pump provides advantages of implementation simplicity and of high performance. The voltage to frequency converter concentrates all offset and leakage errors at the input of the integrator amplifier, which in the preferred embodiment is a chopper stabilized amplifier providing very low offset. The voltage to frequency converter is intended for realization in integrated circuit form, providing very high performance in an integrated circuit having very low power requirements.

DETAILED DESCRIPTION OF THE INVENTION

Figure 1:
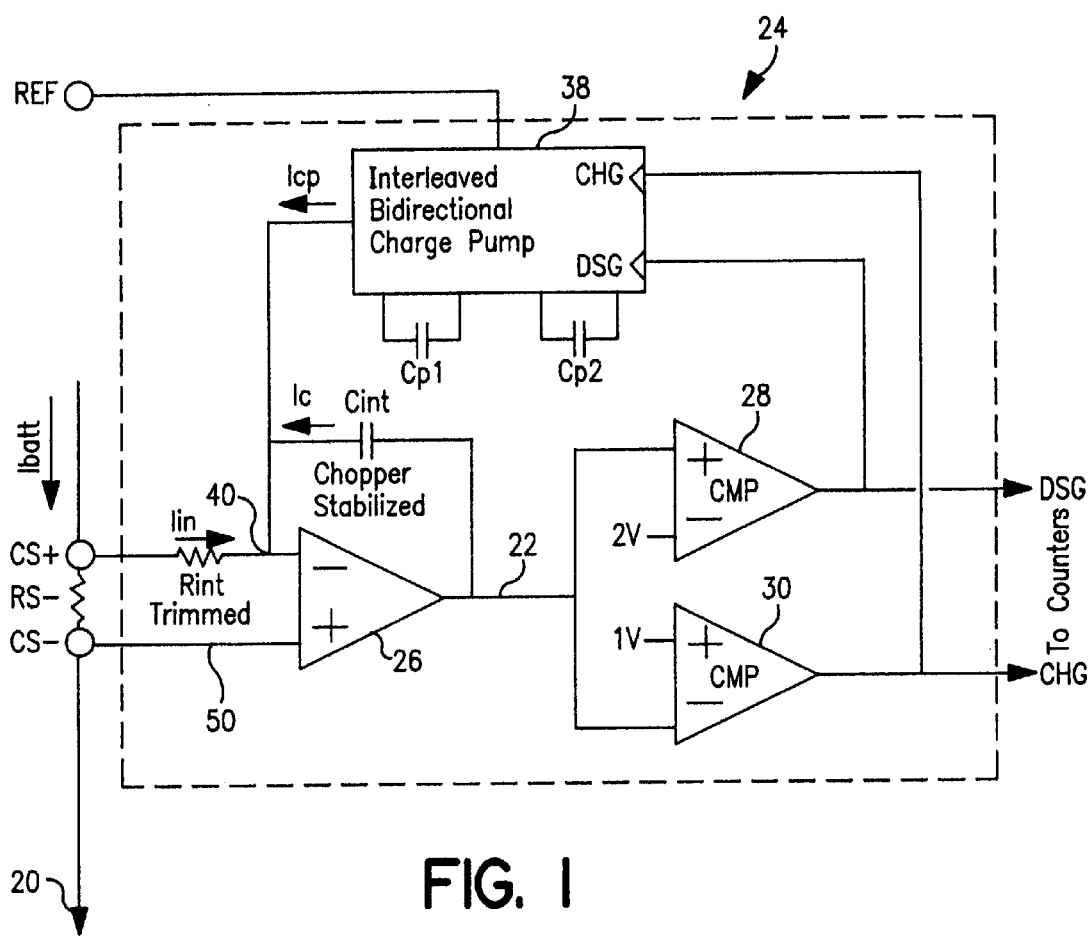
FIG. 1 is a block diagram of the voltage to frequency converter of the present invention.

First referring to FIG. 1, a block diagram of the voltage to frequency converter of the present invention may be seen. The particular embodiment shown is intended for use as a rechargeable battery monitor, monitoring the charge current into and the discharge current out of a rechargeable battery. For this purpose, the battery ground is connected to the system ground 20 through a sense resistor RS of a relatively low resistance value. Thus the voltage across the sense resistor RS at nodes CS+ and CS− is provided as the input voltage to the voltage to frequency converter, generally indicated by the numeral 24.

The voltage on the current sense terminal CS+ is coupled through resistor Rint as the negative input to chopper stabilized differential amplifier 26, the positive input to the amplifier being connected to the current sense terminal CS− (circuit ground). Feedback current Ic for the amplifier 26 is provided through feedback capacitor Cint. With this connection, and neglecting for the moment the additional feedback current Icp, the amplifier acts as an integrator with the characteristic:

$$V_0 = -\frac{1}{R_{int}C_{int}}\int V_{cs}dt$$

where: $V_o$=the output of the differential amplifier
$V_{cs}$=the voltage across the sense resistor RS
t=time The output 22 of the amplifier 26 is coupled as the positive input to comparator 28 and as the negative input of comparator 30. The negative input of comparator 28 in the preferred embodiment is coupled to a two-volt reference voltage and the positive input to comparator 30 is coupled to a one volt reference voltage. With this connection, the output of both comparators will be low when the output 22 of the differential amplifier 26 is between one volt and two volts. If the output of the amplifier is below one volt, the output of comparator 30 will go high, whereas if the output 22 of the amplifier 26 is above two volts, the output of comparator 28 will go high.

The outputs of the comparators 28 and 30 in the preferred embodiment are coupled to interleaved bi-directional charge pump 38 which provides a current Icp to or from node 40, the negative input of the differential amplifier 26, dependent upon whether the charge pump has been triggered to provide current to or to remove current from node 40 by the latest high output from comparator 28 or 30, respectively. The charge pump itself, being interleaved, uses two charge pumping capacitor CP1 and CP2 which, in the preferred embodiment, are equal capacitors both realized in integrated circuit form.

Figure 2:
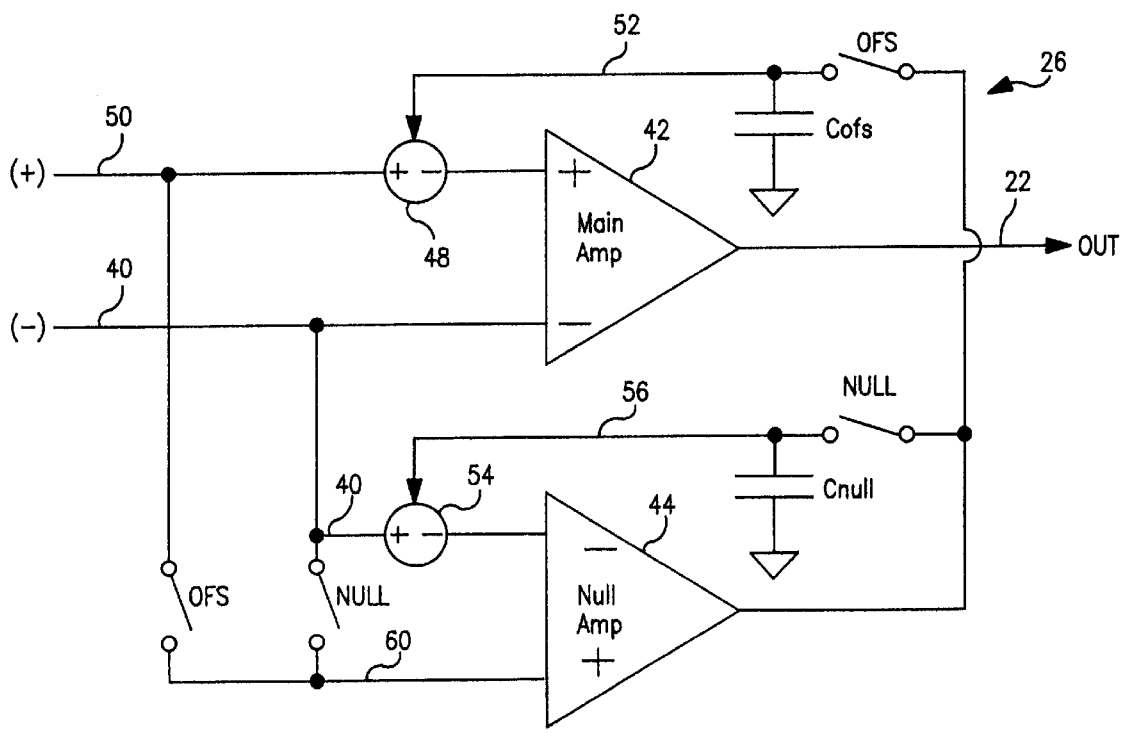
FIG. 2 is a basic block diagram for a chopper stabilized amplifier which may used with the present invention.

Now referring to FIG. 2, a basic block diagram for a chopper stabilized amplifier which may used with the present invention may be seen. In this Figure, the chopper stabilized amplifier 26 is comprised of a main amplifier 42 and a null amplifier 44. The main amplifier 42 has as its negative input, the voltage on line 40, and as its positive input, the output of the summing point 48. The inputs to the summing point 48 are the voltage on the positive input line 50 and the voltage 52 across an offset compensating capacitor COFS. The output 22 of the main amplifier is the output of the overall chopper stabilized differential amplifier 26 of FIG. 1. The null amplifier 44 has as its positive input either the voltage on line 40 through the switch NULL or the voltage on line 50 through the switch OFS, depending on which of these two switches may be closed at the time. The negative input to the null amplifier is the output of a second summing point 54. The inputs to the summing point 54 are the negative input voltage on line 40 and the voltage on line 56, which is equal to the voltage across the nulling capacitor CNULL. A second switch also labeled NULL allows the coupling of the output of the null amplifier to the capacitor CNULL and a second offset switch labeled OFS allows connection of the output of the null amplifier 44 to the offset compensating capacitors COFS. The two switches NULL have common labeling as the two preferably operate in unison, as do the offset compensating switches OFS.

In operation, the circuit alternates between nulling modes and offset compensation modes, preferably at a relatively high rate. During a nulling mode, the NULL switches are closed. This momentarily shorts lines 46 and 60 together, zeroing the voltage there between. The feedback loop comprising the null amp, Cnull and summing junction 54 servo the output of the summing junction such that its output cancels the internal input offset voltage of the null amp. the amount of this cancellation is limited by the open-loop gain of this feedback loop, A to 1/A of its original value.

After each nulling cycle, the null switches NULL are opened and the offset compensation switches OFS are then closed. In this condition, the null amplifier 44, its own offset being nulled out, amplifies the differential voltage across lines 50 and 40 with a gain of A to charge the offset compensation capacitor COFS.

Consider for the moment the characteristics of the main amplifier 42 of FIG. 2 without any offset correction. Because the amplifier 42 has substantial gain and is used in conjunction with a feedback circuit (FIG. 1), the primary source of differential voltage between lines 50 and 40 would be the input offset of the amplifier, the actual differential signal input to the amplifier merely being the amplifier output divided by the gain of the amplifier. Consequently, the differential voltage between lines 50 and 40 may be sensed and a corresponding offset voltage applied to one input of the main amplifier 42 to compensate for most of the offset of the main amplifier. In the offset cancellation mode, the main amplifier and the nulling amplifier are connected in cascade through the summing point 48, and the gain of the overall amplifier is the product of the open-loop gains of the main amp and the nulling amp. The nulling amp is the first amplifier in the cascade, and its input offset voltage will determine the input offset voltage of the amplifier overall. Since its input offset voltage was reduced by 1/A in the nulling phase and stored on Cnull, the input offset voltage of the composite amplifier is very low. When back in the nulling mode, the main amplifier's offset cancellation is stored on Cofs, and the composite amplifier's input offset voltage is still very low.

Figure 3:
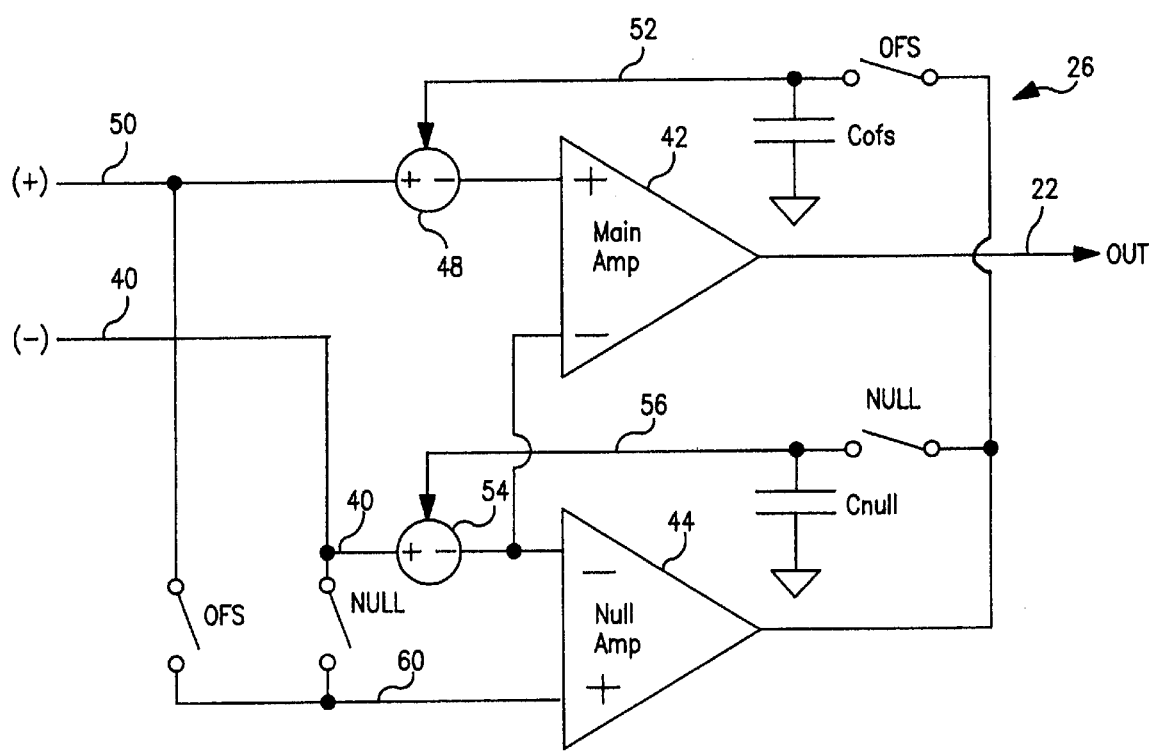
FIG. 3 illustrates a modification to the chopper stabilized amplifier of FIG. 2.

Now referring to FIG. 3, a slight modification of the diagram of FIG. 2 may be seen. In particular, FIG. 3 is the same a FIG. 2 with the exception that the negative input for the main amplifier 42 is connected in common with the negative input of the nulling amplifier 44, rather than being coupled to the negative input line 40. This has certain advantages over the circuit of FIG. 2. Specifically, the common mode offset on CNULL and COFS is rejected. Also, charge injection and leakage from the switches are canceled to the first order.

Figure 4:
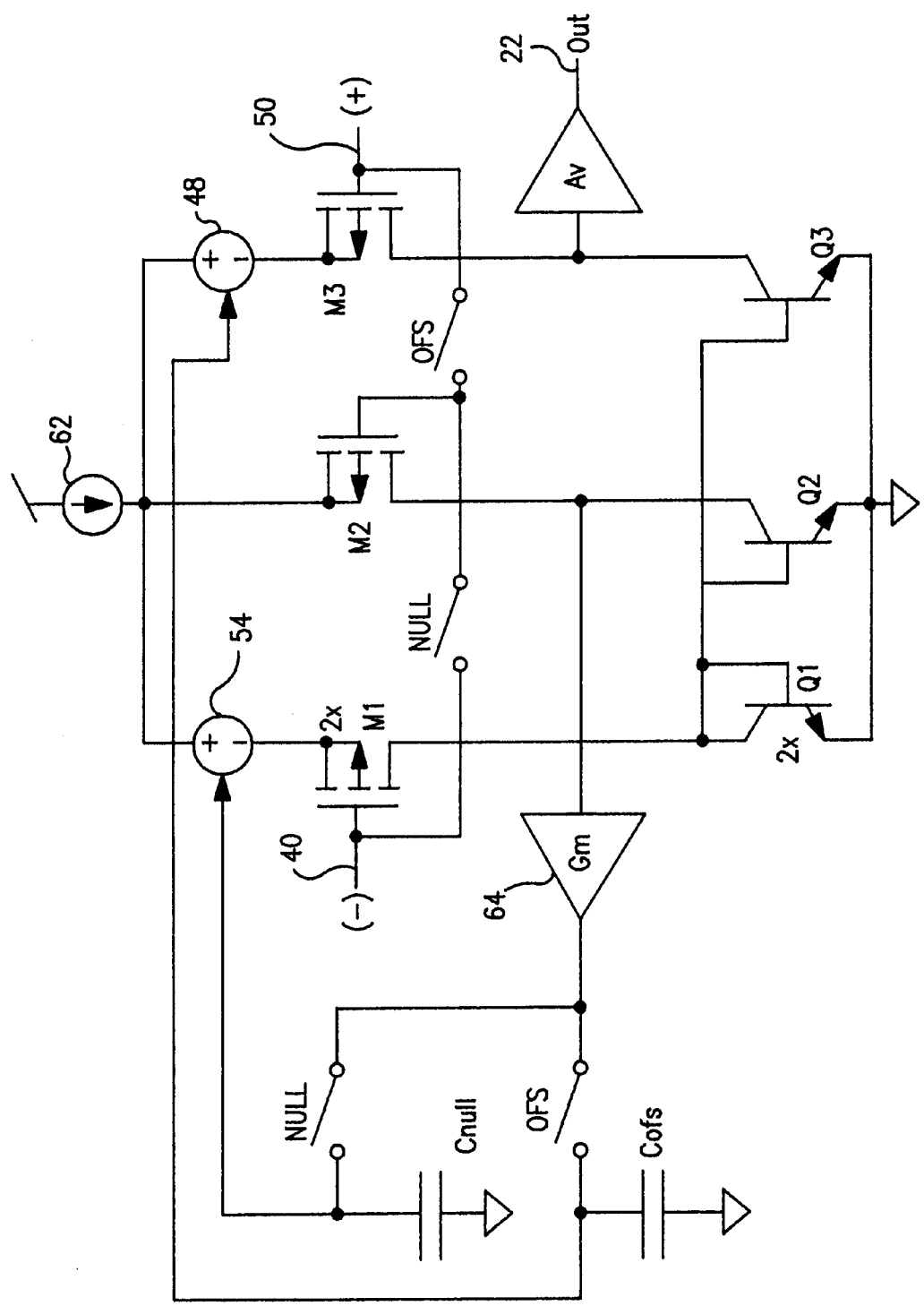
FIG. 4 illustrates a circuit implementation of the chopper stabilized amplifier of FIG. 2 which shares the nulling and offset amplifiers.

Now referring to FIG. 4, an implementation of the chopper stabilized amplifier of FIG. 3 which shares the nulling and offset amplifiers may be seen. In this figure, three p-channel devices M1, M2 and M3 are each coupled in series with NPN transistors Q1, Q2 and Q3, respectively.

Transistors M2 and M3 are the same size, with transistor M1 being twice the size of each of transistors M2 and M3. Similarly, transistors Q2 and Q3 are the same size, with transistor Q1 being twice the size of each of transistors Q2 and Q3. Summing points 48 and 54, in series with the sources of transistors M1 and M3, alter the gate to source voltage of these transistors in much the same manner they would if the same were in series with the gate voltage to the transistors, and accordingly, the summing points 48 and 54 are functionally the same as the summing points 48 and 54 in FIG. 3.

When the circuit is balanced, the current from current source 62 will flow one-fourth through transistor M3, one-fourth through transistor M2 and one-half through transistor M1. The current through transistor M1 will be mirrored by transistor Q1, one-half to transistor Q2 and one-half to transistor Q3, the currents through transistors Q2 and Q3 just matching the currents through transistors M2 and M3, respectively. The gate of transistor M3 may be considered to be equivalent to the positive input of the main amplifier 42 of FIG. 3, the gate of transistor M2 to be equivalent to the positive input of nulling amplifier 44 of FIG. 3 and the gate of transistor M1 to be equivalent to the common negative or inverting input of the nulling amplifier 44 and the main amplifier 42 of FIG. 3. Thus, as before, when the nulling switches NULL are closed, the gates of transistors M1 and M2 are shorted together, equivalent to the shorting of the differential input to the nulling amplifier, with capacitors CNULL being charged through transconductance amplifier 64 to adjust the gate-source voltage of transistor M1 until the current through transistor M2 equals one-half the current through transistor M1. Then, with the nulling switches NULL open and the offset compensating switches OFS closed, the transconductance amplifier 64 forces a voltage onto the offset compensating capacitor COFS to adjust the source voltage of transistor M3 to cancel the input offset of transistor M3. Thus, in this circuit, the offset is limited only by the gain of the feedback loop, and by charge injection and leakage. Matching of the transistors is not a direct limiting function of the circuit.

Figure 5:
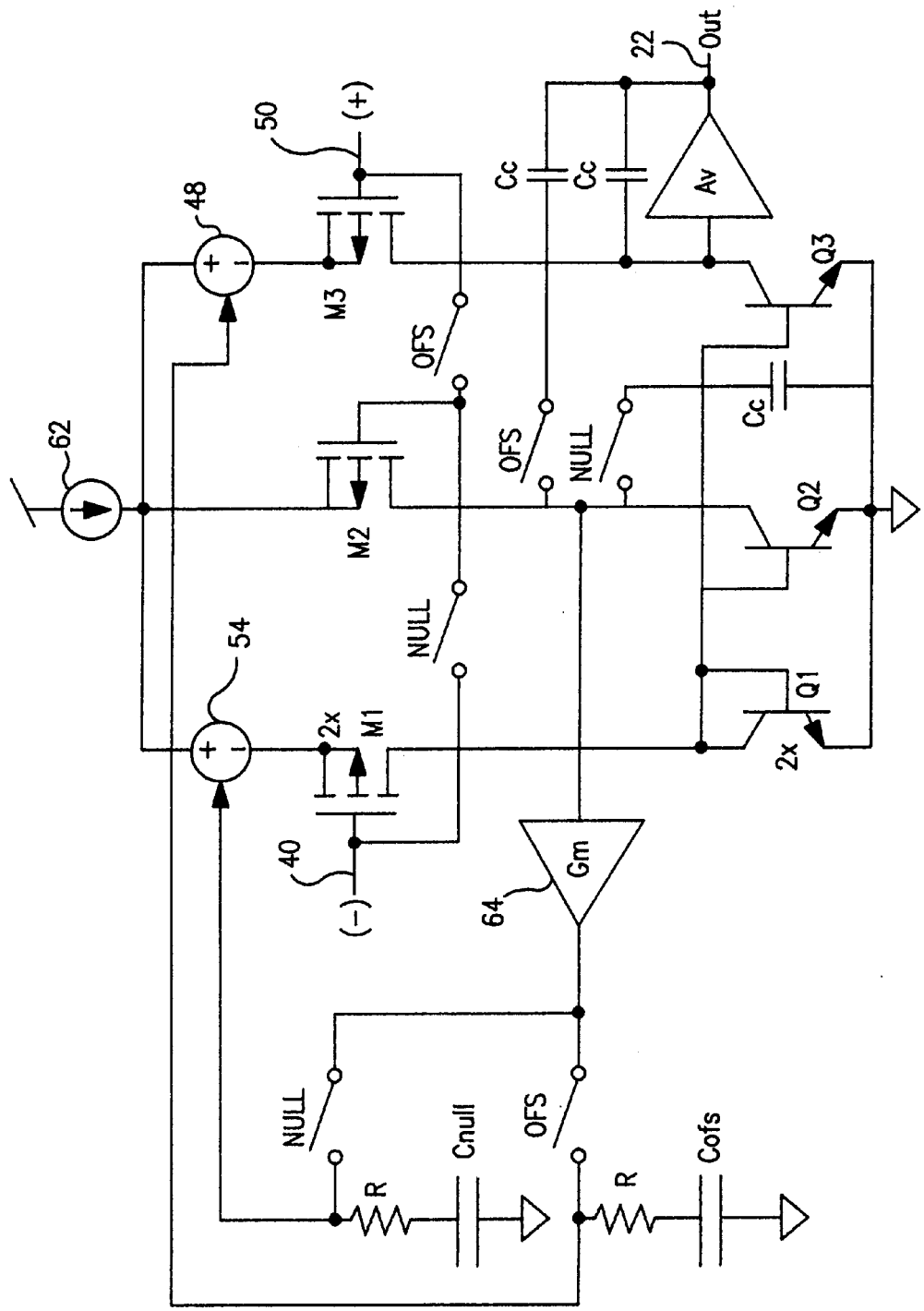
FIG. 5 illustrates a circuit implementation similar to that of FIG. 4 but further including compensation devices.

Now referring to FIG. 5, a circuit similar to that of FIG. 4 may be seen. However, in this circuit, resistors R in series with the capacitors CNULL and COFS have been added to provide a phase boost at high frequency. Also, an additional switch OFS and additional switch NULL have been added, together with three compensating capacitors $C_C$ for additional compensation of the circuit. The amplifier design of FIG. 5 provides the advantage that the slew rate of the main amplifier and the nulling amplifier will match in the offset phase.

It will be noted that in the amplifiers of FIGS. 4 and 5, the positive input to the nulling amplifier (transistor M2), the positive input to the main amplifier (transistor M3), and the common negative input to both the nulling amplifier and the main amplifier (transistor M1), are all gates of p-channel enhancement type MOS devices. Also, while transistor M1 is twice the size of transistors M2 and M3, the difference in size relates to the width of the channel, not the length, so that the thresholds of transistors M1, M2 and M3 are all substantially equal. With this arrangement, together with the fact that the collectors of transistors Q1, Q2 and Q3, and thus the drains of transistors M1, M2 and M3, operate at only 1 VBE above the circuit ground, transistors M1, M2 and M3 will operate as desired with the inputs thereto at or around circuit ground. More specifically, as may be seen in FIGS. 1 and 6, the positive input to the main amplifier operates at ground (plus or minus the input offset of the main amplifier).

Also, because of the feedback, the inverting input to the chopper stabilized amplifier is itself a virtual ground, so that the chopper stabilized amplifier will operate as desired with the amplifier input near the circuit ground, including above and below circuit ground, by selection of an appropriate threshold for transistors M1, M2 and M3 of FIGS. 4 or 5.

Figure 6:
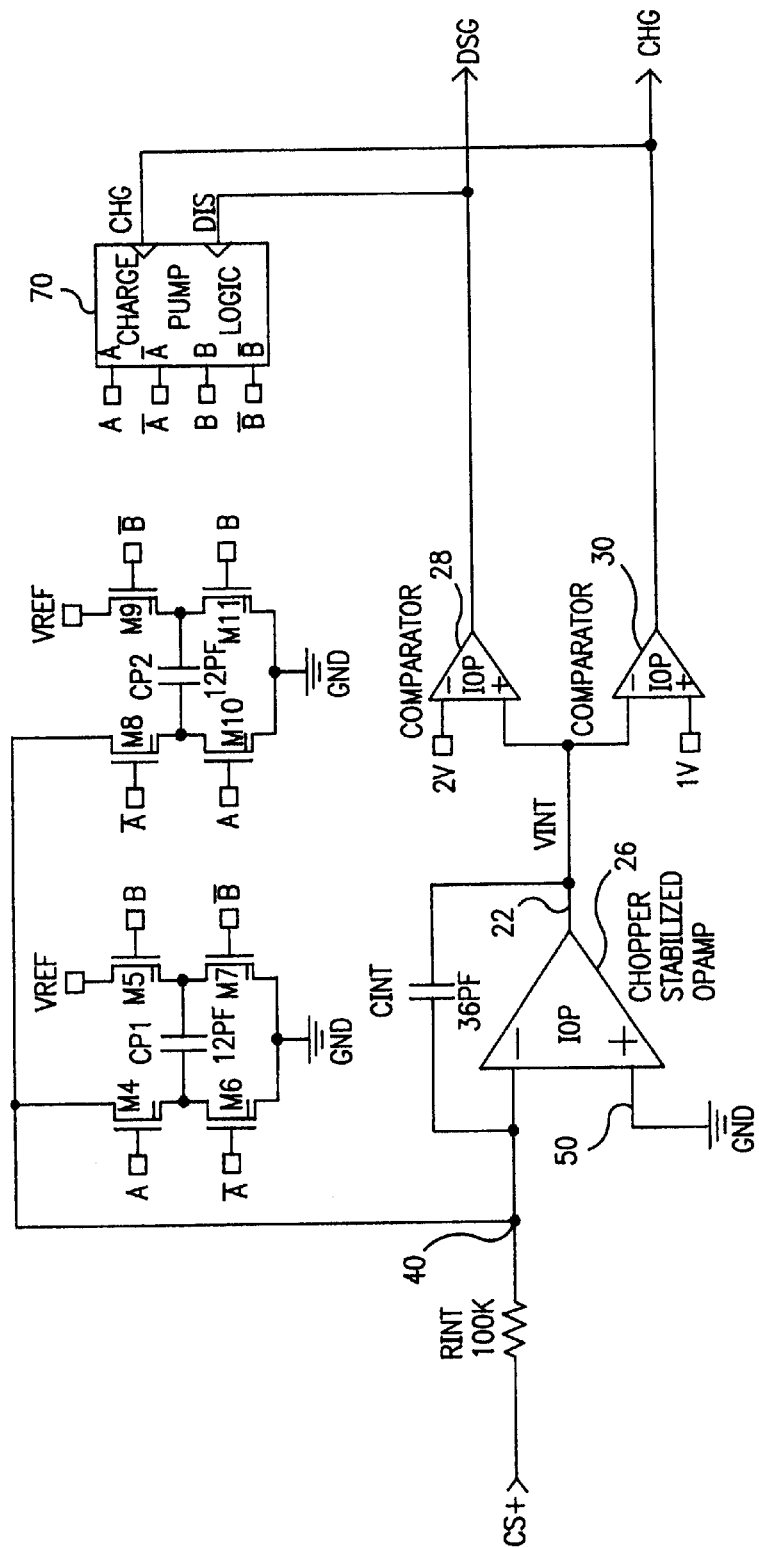
FIG. 6 is a diagram similar to FIG. 1, but showing greater detail in the interleaved bi-directional charge pump.

Now referring to FIG. 6, a diagram similar to FIG. 1, but showing greater detail in the interleaved bi-directional charge pump, may be seen. The charge pump in the preferred embodiment is comprised of charge pump logic 70, responding to the outputs of comparators 28, providing A and B switch control signals and the inverse thereof, $\overline{A}$ and $\overline{B}$, respectively. These switching signals control the gates of eight n-channel MOS devices, M4 through M11. It may be seen from the figure that the signals which control n-channel transistors M4 through M7 are the inverse of the signals which control n-channel devices M8 through M11, respectively. In this circuit, no two series connected n-channel devices should be on at the same time, so that the waveforms for each signal, A and B, should be overlapping with their inverse, $\overline{A}$ and $\overline{B}$, respectively, in the low state (respective transistor off), as opposed to in the high state. In this manner, any one of the pair of series connected transistors will clearly be off before the other transistor in the series connection can turn on.

The operation of the charge pump may be described as follows. Node 40 is a virtual ground so that the charge pumps are, in essence, pumping to or from the ground connection. Considering first n-channel transistors M4 through M7, when A and B are both low, $\overline{A}$ and $\overline{B}$ will be high, turning on transistors M6 and M7. This discharges capacitor CP1. Then, if A and B both go high, transistors M6 and M7 will be turned off and transistors M4 and M5 turned on. Because node 40 will remain a virtual ground, capacitor CP1 will provide a charge into node 40 equal to CP1 * VREF. Also when signals A and B go high to dump charge from capacitor CP1 to node 40, transistors M10 and M11 will be on, discharging capacitor CP2. Then, when signals A and B go low again, transistors M10 and M11 are turned off, and transistors M8 and M9 are turned on, so that capacitor CP2 will dump a charge to node 40 equal to CP2 * VREF, thus providing the interleaved charge pumping. At the same time, transistors M4 and M5 will be turned off and transistors M6 and M7 will be turned on, discharging capacitor CP1 again. The net effect is that charge is pumped to node 40 from capacitor CP1 when both signals A and B go from low to high, and from capacitor CP2 when signals A and B go from high to low.

Charge may be pumped from node 40 by first turning on transistors M5 and M6 (A low and B high) to charge the capacitor CP1 to VREF and then to turn off transistors M6 and M5 and turn on transistors M4 and M7 (A high and B low) to pull charge out of node 40 to discharge capacitor CP1 (one end of the capacitor now being tied to the circuit ground and the other end of the capacitor now being tied to a virtual ground). This pulls a charge from node 40 equal to CP1 * VREF. The combination of the signals A high and B low will also turn on transistors M9 and M10 to charge capacitor CP2 to VREF, with the subsequent change to B high and A low turning off transistors M9 and M10 and turning on transistors M8 and M11 to pull a charge from node 40 equal to CP2 * VREF. Now the net effect is that charge is pumped from node 40 by capacitor CP1 when the signals go from A low and B high to A high and B low, and charge is pumped from node 40 by capacitor CP2 when the signals go from A high and B low to A low and B high. Thus, the two charge pumps are interleaved when either providing current to or current from node 40, in either case the current provided in two successive charge pumping cycles having a magnitude of (CP1+CP2) * VREF. If charge pumping is continued at a fixed frequency F, the corresponding current will be VREF * F * (CP1+CP2)/2, where F is the frequency of each cycle of the interleaved pumping cycles (VREF * F * (CP1+CP2) for the pair of interleaved cycles).

In the interleaved charge pump just described, one of the charge pumping capacitors CP1 or CP2 will in a state for immediate reversal of the pumping direction. By way of example, consider the sequence for pumping current into node 40 of FIG. 6. In this sequence, either A and B are both high or A and B are both low. When signals A and B are both high, capacitor CP1 is charged from VREF through transistor M5 and transistor M4, the charging current flowing through transistor M5, capacitor CP1, transistor M4 to node 40. If at that time the charge pumping direction were to reverse, signal A would remain high and signal B would be driven low, leaving transistor M4 on and now turning off transistor M5 and turning on transistor M7. This causes capacitor CP1 to immediately discharge again, removing from node 40 the charge that was dumped to node 40 in the immediately previous cycle. While this is but one example, it can be shown that regardless of which capacitor just completed a pumping cycle and regardless of whether the pumping cycle was pumping charge to or from node 40, that capacitor will be ready to immediately pump in the opposite direction if required, the other capacitor being charged or discharged during the first reversed cycle so as to be ready to pump charge to or from node 40 on the next cycle as required in accordance with the charging pumping direction reversal.

Figure 7:
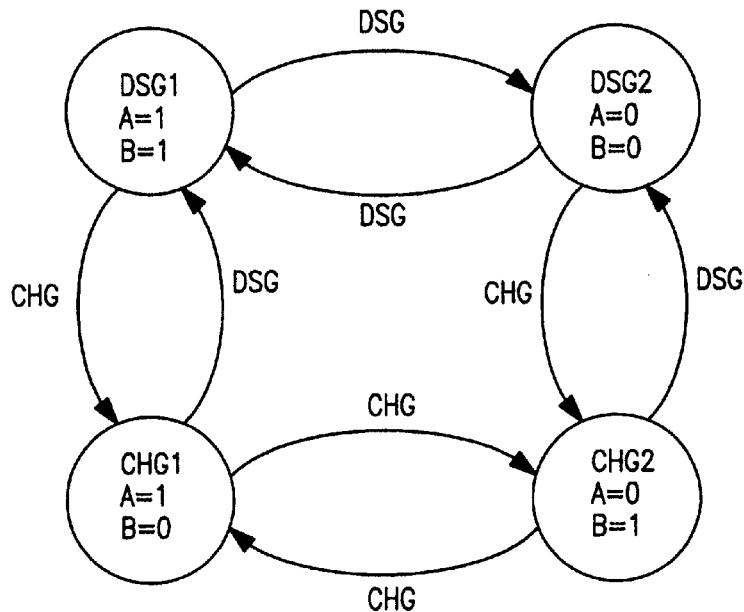
FIG. 7 presents the full state diagram for the interleaved charge pump control signals A and B.

This is to be compared with a single switched capacitor charge pump which alternates between charge pumping on every other cycle, and setting the capacitor charge for the desired pumping in the interleaved cycles. In this case, on completion of one pumping cycle, followed by the resetting of the capacitor charge as appropriate for continued pumping in the same direction, a charge pump direction reversal at that time would require a further cycle time to reset the capacitor charge as appropriate for pumping in the reverse direction before an actual charge pump operation in the reverse direction could be executed. The full state diagram for signals A and B and the charge pumping in the preferred embodiment of the present invention is shown in FIG. 7.

In the preferred embodiment, capacitors CP1 and CP2 are matched, with each individual pumping cycle representing approximately two-thirds of the sensing window. Stated differently, the range of output of the chopper stabilized amplifier 26 is from 1 volt to 2 volts. In the preferred embodiment, the charge pumped into or out of node 40 on each pumping cycle (CP1 * VREF or CP2 * VREF) will result in a corresponding charge on the integrating capacitor CINT of approximately two-thirds of the 1 volt window, or two-thirds of a volt.

Figure 8:
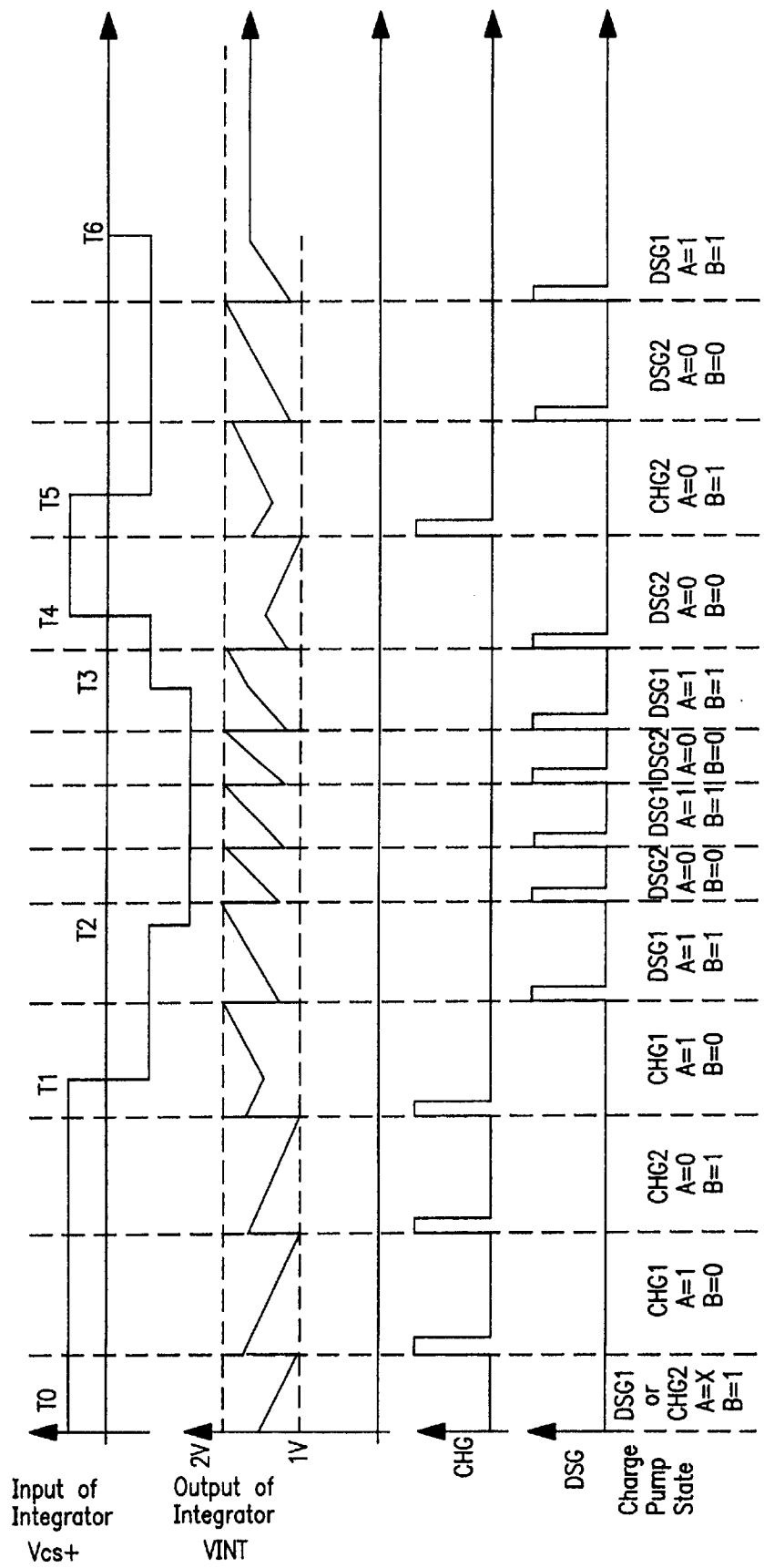
FIG. 8 illustrates typical waveforms in the voltage to frequency converter of the preferred embodiment of the present invention.

Referring to FIG. 8, typical waveforms in the voltage to frequency converter of the preferred embodiment of the present invention may be seen. The top curve is an exemplary input to the CS+ input terminal of the voltage to frequency converter 24 of FIG. 1, relative of course to the CS− or circuit ground terminal 20. The exemplary waveform represents a steady battery charging current IBATT between times T0 and T1, followed by an approximately equal net discharging current between times T1 and T2, a greater discharging current between times T2 and T3, and again reduced discharging current between times T3 and T4, a return of the charging current between times T4 and T5, a return of a net discharging current between times T5 and T6, followed by a substantially zero battery current thereafter. The state of the charge pump logic 70 (FIG. 6) at time T0, as shown in the lower power of FIG. 8, will be with the B signal high and with the A signal high or low, dependent upon the previous history of the circuit. The second curve in FIG. 8 represents the output 22 VINT of the chopper stabilized amplifier 26 (see FIG. 6). The positive voltage CS+ during the time period T0 to T1 produces a downward ramp voltage at the output of the integrator, triggering comparator 30 when the 1 volt lower limit of the comparison window is reached. This triggers the output of comparator 30 high, providing a charge pulse CHG to the output of the circuit (FIG. 6) and to the charge pump logic 70 to trigger a change in the output of the charge pump logic to the state A=1 or high, and B=0 or low. As previously shown, this pulls a charge from node 40 of FIG. 6 equal to CP1 * VREF, which as stated before, in the preferred embodiment is equal to about two-thirds of a volt at the output of the integrator. The output of the integrator then again ramps downward, triggering comparator 30 again, which causes an additional output pulse and triggers the charge pump logic 70 to the state where A is low and B is high, now pulling the charge from node 40 equal to CP2 * VREF. So long as the charging current remains constant, a saw-tooth waveform in the output of the integrator will be generated as shown in FIG. 8, alternately using capacitors CP1 and CP2 to pump charge from node 40 and generating a pulse train CHG having a frequency proportional to the charging current.

At time T1, the charging current changed to a net discharging current between times T1 and T2. This causes a reversal in the saw-tooth waveform in the integrator output, with comparator 28 being triggered at each saw-tooth peak to provide an output pulse DSG and to trigger the charge pump logic to change the signals A and B from A high and B low to both A and B high. The discharge signal DSG pulses high at each peak of the saw-tooth ramp to provide the output pulse DSG and to trigger the charge pump logic 70 to change the state of the signals A and B from A and B both high to A and B both low, or from A and B both low to A and B both high, as the case may be. As may be seen, by way of example, in the time period between T1 and T4, the frequency of the pulses of the output signal DSG is directly proportional to the amplitude of the negative value of the input voltage $V_{cs+}$, and thus directly proportional to the discharge current of the battery.

Note that in the explanation of FIG. 8 so far, the state of signals A and B at time T1 happens to be A=1 and B=0. The change to that state from the prior state A=0 and B=1 pulled a charge from node 40 equal to CP1 * VREF. When the charging current changed to a discharging current at time T1, the change of signal state at the first following triggering of comparator 28 was from A=1 and B=0 to A=1 and B=1. This had the effect of dumping a charge equal to CP1 * VREF to node 40 in a reversal of the charge pumping direction. Had the state of signals A and B at time T1 been A=0 and B=1, then the first discharge pulse DSG output by comparator 28 would have caused a change of state in the signals A and B to A=0 and B=0, instead of A=1 and B=1. In either event, it is important to note that the first charge pump cycle after a charge pump direction reversal will be a pumping of the same charge of the same capacitor as made the last charge pump cycle before the reversal. This has the advantage that, even though two interleaved charge pumps are used, the number of net pumping cycles by either of capacitors CP1 or CP2 cannot differ from the number of net charging cycles by the other capacitor by more than one cycle, independent of the length of time of operation of the circuit. Thus, while the capacitors CP1 and CP2 formed by integrated circuit fabrication techniques may not be perfectly matched, their mismatch cannot lead to a cumulative error in the voltage to frequency conversion.

Referring again to FIG. 8, at time T6, the voltage VCS+ is shown to return to zero and remain there, indicating that the battery is now neither charging nor discharging. Thus, the output of the integrator VINT will remain constant at its value at time T6, and neither comparator 28 nor 30 will be triggered thereafter. Accordingly, the frequency of the pulses of CHG over any period of time is indicative of the rate of charge of the battery over that time, and the frequency of the pulses DSG over any period of time is indicative of the rate of discharge of the battery over that time. By using an up-down counter, one can easily accumulate the net difference between the number of charge pulses CHG and the number of discharge pulses DSG to determine the net charge to or net charge from the battery over any period of time to provide an indication of the state of charge of the battery at any time.

It will be noted from FIG. 8 that while the battery charge or discharge current may rapidly change as the charging currents and loads on the battery change, the output of the integrator only rapidly changes during each charge pumping cycle, and then by an amount less than the comparator sensing window. As such, one can be assured that upon initiation of a charge pumping cycle, the charge pumping cycle will be completed well before a subsequent charge pump cycle in either direction can be initiated. Also, while the charging and discharging currents in FIG. 8 are shown to change rapidly, as would occur by the turning on and turning off of various loads, the circuit is of course not limited to such applications, as the voltage to frequency converter will equally accurately respond to slowly varying battery current changes as well as the step changes shown.

The present invention provides a voltage to frequency converter having low voltage sensing both above and below ground to sense the voltage across the sense resistor having one end thereof tied to the circuit ground, independent of the direction of the current through the sense resistor. The use of a chopper stabilized amplifier for the integrator provides an integrator having a much lower offset than can normally be achieved with ordinary integrated circuit amplifiers. Further, the use of the interleaved charge pump avoids the need for the single capacitor of a single charge pump to be reset by additional timing circuitry, allowing for savings in the power supply current. Also, the interleaved charge pump has the advantage that when changing from a positive input to a negative input, the interleaving scheme requires minimal additional analog circuitry, which also provides for a savings in supply current. The present invention has the further advantage of concentrating all offset and leakage errors at the input to the integrating chopper stabilized amplifier, which makes for a higher performance design.

While a certain exemplary embodiment has been described in detail and shown in the accompanying drawings, it is to be understood that such embodiment is merely illustrative of and not restrictive on the broad invention, and that this invention is not to be limited to the specific arrangements and constructions shown and described, since various other modifications may occur to those with ordinary skill in the art.

What is claimed:

1. A voltage to frequency converter comprising:
   an operational amplifier having positive and negative inputs and being coupled as an integrator, an integrator input of the integrator being coupled as a converter input of the voltage to frequency converter;

a comparator circuit having an input coupled to an output of the operational amplifier, the comparator circuit generating a discharge output signal responsive to the output of the operational amplifier reaching a first output voltage limit and generating a charge output signal responsive to the output of the operational amplifier reaching a second output voltage limit; and, first and second charge pumps, the first charge pump transferring a first predetermined charge into or out of the negative input when the second charge pump is resetting and the second charge pump transferring a second predetermined charge into or out of the negative input when the first charge pump is resetting, the first and second charge pumps each alternately transferring the first and second predetermined charges into the negative input in response to a repetitive generation of the discharge output signal, the first and second charge pumps each alternately transferring the first and second predetermined charges out of the negative input in response to a repetitive generation of the charge output signal, the last one of the first and second charge pumps to transfer charge in response to the discharge output signal or the charge output signal being the next one to transfer charge in response to generation of the charge output signal following the discharge output signal, or the discharge output signal following the charge output signal.

2. The voltage to frequency converter of claim 1 wherein, the positive and negative inputs of the operational amplifier are a differential input formed by gates of MOS transistors, the threshold of the MOS transistors being selected for operation of the operational amplifier on inputs thereto above and below a voltage level of a circuit ground.

3. The voltage to frequency converter of claim 1 wherein, the first predetermined charge of the first charge pump and the second predetermined charge of the second charge pump each transfer an amount of charge in response to the discharge output signal and the charge output signal of the comparator circuit on each charge pump cycle to change the output of the operational amplifier by a voltage of approximately two thirds the voltage between the first and second output voltage limits.

4. The voltage to frequency converter of claim 1 wherein, the operational amplifier is chopper stabilized to provide a chopper stabilized amplifier output proportional to the integral of the input thereto.

5. The voltage to frequency converter of claim 1 wherein, the first predetermined charge of the first charge pump is determined by a first capacitor value multiplied by a reference voltage value and the second predetermined charge of the second charge pump is determined by a second capacitor value multiplied by the reference voltage value.

6. The voltage to frequency converter of claim 5 wherein, the first capacitor value is imperfectly matched with the second capacitor value and the alternate transfer of charges by the first charge pump and the second charge pump into or out of the negative input terminal reduces a cumulative error in the voltage to frequency converter.

7. The voltage to frequency converter of claim 1 further comprising:

an up-down counter coupled to the comparator circuit to count the frequency of pulses respectively of the charge and discharge output signals and indicate a net level of volt-seconds input into the integrator.

8. A voltage to frequency converter comprising:

an operational amplifier coupled between a power supply terminal and a circuit ground, the operational amplifier being coupled as an integrator for receiving positive and negative input signals, an integrator input of the integrator being coupled as a converter input of the voltage to frequency converter, the operational amplifier being chopper stabilized to provide a chopper stabilized amplifier output proportional to the integral of the input thereto, the operational amplifier having a differential input formed by gates of MOS transistors, the threshold of the MOS transistors being selected for operation of the operational amplifier on inputs thereto above and below the circuit ground;

a comparator circuit having an input coupled to an output of the operational amplifier, the comparator circuit generating a discharge output signal responsive to the output of the operational amplifier reaching a first output voltage limit and generating a charge output signal responsive to the output of the operational amplifier reaching a second output voltage limit; and, first and second charge pumps, the first charge pump transferring a first predetermined charge into or out of the differential input when the second charge pump is resetting and the second charge pump transferring a second predetermined charge into or out of the differential input when the first charge pump is resetting, the first and second charge pumps each alternately transferring the first and second predetermined charges into the differential input in response to a repetitive generation of the discharge output signal, the first and second charge pumps each alternately transferring the first and second predetermined charges out of the differential input in response to a repetitive generation of the charge output signal, the last one of the first and second charge pumps to transfer charge in response to the discharge output signal or the charge output signal being the next one to transfer charge in response to the generation of the charge output signal following the discharge output signal, or the discharge output signal following the charge output signal.

9. The voltage to frequency converter of claim 8 wherein, the first predetermined charge of the first charge pump and the second predetermined charge of the second charge pump each transfers an amount of charge in response to the discharge output signal and the charge output signal of the comparator circuit on each charge pump cycle to change the output of the operational amplifier by a voltage of approximately two thirds the voltage between the first and second output voltage limits.

10. A voltage to frequency converter comprising:

an operational amplifier having positive and negative inputs and being coupled as an integrator, an integrator input of the integrator being coupled as a converter input of the voltage to frequency converter;

a comparator circuit responsive to an output of the operational amplifier to provide discharge and charge comparator outputs responsive to the output of the operational amplifier reaching first and second output voltage limits respectively; and, a charge pump coupled to the negative input of the operational amplifier, the charge pump having at least two individual charge pumps responsive to the discharge and charge comparator outputs of the comparator circuit, each individual charge pump to transfer a respective predetermined charge into and out of the negative input of the operational amplifier in an interleaving and bidirectional manner, when the voltage level on the negative input of the integrator is above a reference voltage input at the positive input of the operational amplifier and the output of the operational amplifier reaches the first output voltage limit, the at least two individual charge pumps operate alternatively to successively transfer the respective predetermined charge out of the negative input, when the negative voltage level on the input of the integrator is below the reference voltage input at the positive input of the operational amplifier and the output of the operational amplifier reaches the second output voltage limit, the at least two individual charge pumps operate alternatively to successively transfer the respective predetermined charge into the negative input of the operational amplifier, and when the negative input of the integrator changes from being above to being below the reference voltage input or changes from being below to being above the reference voltage input and the output of the operational amplifier reaches the first or second output voltage limits, one of the at least two individual charge pumps reverses its prior charge transfer of the respective predetermined charge into or out of the negative input of the operational amplifier.

11. The voltage to frequency converter of claim 10 wherein, each individual charge pump transfers an amount of charge in response to the discharge and charge comparator outputs of the comparator circuit on each charge pump cycle to change the output of the operational amplifier by a voltage of approximately two thirds the voltage between the first and second output voltage limits.

12. A rechargeable battery monitor comprising:

a resistor for coupling between a battery and a circuit ground;

an operational amplifier having positive and negative inputs, the operational amplifier being coupled as an integrator with the resistor coupled across integrator input terminals of the integrator, the operational amplifier being chopper stabilized to provide a chopper stabilized amplifier output proportional to the integral of the voltage across the resistor;

a comparator circuit having an input coupled to an output of the operational amplifier, the comparator circuit generating a discharge output signal responsive to the output of the operational amplifier reaching a first output voltage limit and generating a charge output signal responsive to the output of the operational amplifier reaching a second output voltage limit; and, first and second charge pumps, the first charge pump transferring a first predetermined charge into or out of the negative input when the second charge pump is resetting and the second charge pump transferring a second predetermined charge into or out of the negative input when the first charge pump is resetting, the first and second charge pumps each alternately transferring the first and second predetermined charges into the negative input in response to a repetitive generation of the discharge output signal, the first and second charge pumps each alternately transferring the first and second predetermined charges out of the negative input in response to a repetitive generation of the charge output signal, the last one of the first and second charge pumps to transfer charge in response to the discharge output signal or the charge output signal being the next one to transfer charge in response to generation of the charge output signal following the discharge output signal, or the discharge output signal following the charge output signal.

13. The rechargeable battery monitor of claim 12 coupled between a power supply terminal and the circuit ground, wherein the positive and negative inputs of the operational amplifier are a differential input formed by gates of MOS transistors, the threshold of the MOS transistors being selected for operation of the operational amplifier on inputs thereto above and below a voltage level of the circuit ground.

14. The rechargeable battery monitor of claim 12 wherein, the first predetermined charge of the first charge pump and the second predetermined charge of the second charge pump each transfer an amount of charge in response to the discharge output signal and the charge output signal of the comparator circuit on each charge pump cycle to change the output of the operational amplifier by a voltage of approximately two thirds the voltage between the first and second output voltage limits.

15. A rechargeable battery monitor comprising:

a resistor for coupling between a battery and a circuit ground;

an operational amplifier coupled between a power supply terminal and a circuit ground, the operational amplifier being coupled as an integrator with the resistor coupled across integrator input terminals of the integrator, the operational amplifier being chopper stabilized to provide a chopper stabilized amplifier output proportional to the integral of the voltage across the resistor, the operational amplifier having a differential input formed by gates of MOS transistors, the threshold of the MOS transistors being selected for operation of the operational amplifier on inputs thereto above and below a voltage level of the circuit ground;

a comparator circuit having an input coupled to an output of the operational amplifier, the comparator circuit generating discharge and charge battery monitor output signals responsive to the output of the operational amplifier reaching a first output voltage limit and a second output voltage limit respectively; and, first and second charge pumps, the first charge pump transferring a first predetermined charge into or out of the differential input when the second charge pump is resetting and the second charge pump transferring a second predetermined charge into or out of the differential input when the first charge pump is resetting, the first and second charge pumps each alternately transferring the first and second predetermined charges into the differential input in response to a repetitive generation of the discharge battery monitor output signal, the first and second charge pumps each alternately transferring the first and second predetermined charges out of the differential input in response to a repetitive generation of the charge battery monitor output signal, the last one of the first and second charge pumps to transfer charge in response to the discharge battery monitor output signal or charge battery monitor output signal being the next one to transfer charge in response to generation of the charge battery monitor output signal following the discharge battery monitor output signal, or the discharge battery monitor output signal following the charge battery monitor output signal.

16. The rechargeable battery monitor of claim 15 wherein, each individual charge pump transfers an amount of charge in response to the charge and discharge battery monitor output signals of the comparator circuit on each charge pump cycle to change the output of the operational amplifier by a voltage of approximately two thirds the voltage between the first and second output voltage limits.

17. A rechargeable battery monitor comprising:

a resistor for coupling between a battery and a circuit ground;

an operational amplifier having positive and negative inputs, the operational amplifier being coupled as an integrator with the resistor coupled across integrator input terminals of the integrator to provide an amplifier output proportional to the integral of the voltage across the resistor;

a comparator circuit responsive to an output of the operational amplifier to provide discharge and charge comparator outputs responsive to the output of the operational amplifier reaching first and second output voltage limits respectively; and, a charge pump coupled to the negative input of the operational amplifier, the charge pump having at least two individual charge pumps responsive to the discharge and charge comparator outputs of the comparator circuit, each individual charge pump to transfer a respective predetermined charge into and out of the negative input of the operational amplifier in an interleaving and bidirectional manner, when the voltage level across the resistor and input to the integrator is above a reference voltage input at the positive input of the operational amplifier and the output of the operational amplifier reaches the first output voltage limit, the at least two individual charge pumps operate alternatively to successively transfer the respective predetermined charge out of the negative input, when the voltage level across the resistor and input to the integrator is below the reference voltage input at the positive input of the operational amplifier and the output of the operational amplifier reaches the second output voltage limit, the at least two individual charge pumps operate alternatively to successively transfer the respective predetermined charge into the negative input, and when the negative input of the operational amplifier changes from being above to being below the reference voltage input or changes from being below to being above the reference voltage input and the output of the operational amplifier reaches the first or second output voltage limits, one of the at least two individual charge pumps reverses its prior charge transfer of the respective predetermined charge into or out of the negative input of the operational amplifier.

18. The rechargeable battery monitor of claim 17 wherein, each individual charge pump transfers an amount of charge in response to the discharge and charge output signals of the comparator circuit on each charge pump cycle to change the output of the operational amplifier by a voltage of approximately two thirds the voltage between the first and second output voltage limits.

* * * * *